(12) United States Patent
Gu et al.

(10) Patent No.: US 11,004,527 B2
(45) Date of Patent: May 11, 2021

(54) SHIFT REGISTER, GATE DRIVE CIRCUIT, DRIVING METHOD THEREOF, AND DISPLAY DEVICE

(71) Applicants: Hefei BOE Optoelectronics Technology Co., Ltd., Anhui (CN); BOE Technology Group Co., Ltd., Beijing (CN)

(72) Inventors: Honggang Gu, Beijing (CN); Xianjie Shao, Beijing (CN); Fei Zhao, Beijing (CN)

(73) Assignees: Hefei BOE Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 92 days.

(21) Appl. No.: 16/377,342

(22) Filed: Apr. 8, 2019

(65) Prior Publication Data
US 2019/0392916 A1 Dec. 26, 2019

(30) Foreign Application Priority Data
Jun. 20, 2018 (CN) .......................... 201810638525.6

(51) Int. Cl.
*G11C 19/00* (2006.01)
*G11C 19/28* (2006.01)
*G09G 3/20* (2006.01)

(52) U.S. Cl.
CPC ............ *G11C 19/287* (2013.01); *G09G 3/20* (2013.01); *G11C 19/28* (2013.01);
(Continued)

(58) Field of Classification Search
None
See application file for complete search history.

(56) References Cited

U.S. PATENT DOCUMENTS

| 10,540,938 B2 * | 1/2020 | Kim ...................... G09G 3/3677 |
| 2006/0267909 A1 * | 11/2006 | Hsu ....................... G09G 3/3677 |
| | | 345/100 |

(Continued)

FOREIGN PATENT DOCUMENTS

| CN | 107093415 A | 8/2017 |
| CN | 107799070 A | 3/2018 |

(Continued)

OTHER PUBLICATIONS

Chinese Office Action corresponding to 201810638525.6 dated Nov. 4, 2020.

*Primary Examiner* — Tuan T Lam
(74) *Attorney, Agent, or Firm* — Arent Fox LLP; Michael Fainberg

(57) ABSTRACT

The disclosure discloses a shift register, a gate drive circuit, a driving method thereof, and a display device, and the shift register includes: an input sub-circuit, an output sub-circuit, and an output control sub-circuit, where the input sub-circuit is configured to provide a signal of a first reference voltage signal terminal to a pull-up node under control of an input signal terminal; the output sub-circuit is configured to provide a signal of a clock signal terminal to a first signal output terminal under control of a potential of the pull-up node; and the output control sub-circuit is configured to provide a signal of the first signal output terminal to a second signal output terminal under joint control of an output control signal terminal, a third reference voltage signal terminal, and a fourth reference voltage signal terminal.

19 Claims, 7 Drawing Sheets

(52) U.S. Cl.
CPC ............... *G09G 2300/0426* (2013.01); *G09G 2310/0286* (2013.01); *G09G 2310/08* (2013.01)

(56) References Cited

U.S. PATENT DOCUMENTS

| | | | |
|---|---|---|---|
| 2009/0040168 A1* | 2/2009 | Liu | G09G 3/3677 345/100 |
| 2010/0109996 A1* | 5/2010 | Park | G09G 3/3677 345/100 |
| 2012/0239316 A1* | 9/2012 | Foote | G01F 23/296 702/55 |
| 2017/0039968 A1* | 2/2017 | Chen | G09G 3/3677 |
| 2017/0178558 A1* | 6/2017 | Zhou | G11C 19/28 |
| 2018/0315389 A1* | 11/2018 | Hong | G11C 19/28 |
| 2019/0164497 A1* | 5/2019 | Wang | G11C 7/222 |
| 2019/0180666 A1 | 6/2019 | Yu et al. | |
| 2019/0180834 A1* | 6/2019 | Yuan | G09G 3/3677 |
| 2019/0206503 A1* | 7/2019 | Zhang | G11C 19/287 |
| 2019/0228830 A1* | 7/2019 | Xu | G11C 19/28 |
| 2020/0160767 A1* | 5/2020 | Mi | G09G 3/20 |

FOREIGN PATENT DOCUMENTS

| | | |
|---|---|---|
| CN | 107945762 A | 4/2018 |
| CN | 108122529 A | 6/2018 |
| JP | 2015143844 A | 8/2015 |

\* cited by examiner

SHIFT REGISTER, GATE DRIVE CIRCUIT, DRIVING METHOD THEREOF, AND DISPLAY DEVICE

CROSS-REFERENCE TO RELATED APPLICATION

This application claims the benefit of Chinese Patent Application No. 201810638525.6, filed with the Chinese Patent Office on Jun. 20, 2018, the content of which is hereby incorporated by reference in its entirety.

FIELD

This disclosure relates to the field of display technologies, and particularly to a shift register, a gate drive circuit, a driving method thereof, and a display device.

DESCRIPTION OF THE RELATED ART

In a flat display panel, gate ON signals are typically provided by a gate drive circuit to gates of respective Thin Film Transistors (TFTs) in a pixel area. The gate drive circuit can be formed on an array substrate of the flat display panel in an array process, i.e., a Gate Driver on Array (GOA) process; and with this integration process, a cost can be saved, a good-looking design of the flat display panel with two symmetric sides can be provided, and also a bonding area and a wiring space for fan-out of a gate Integrated Circuit (IC) can be dispensed with, thus providing a design of the flat display panel with a narrow bezel.

SUMMARY

Embodiments of the disclosure provide a shift register, a gate drive circuit, a driving method thereof, and a display device.

In one aspect, the embodiments of the disclosure provide a shift register including: an input sub-circuit, an output sub-circuit, and an output control sub-circuit, wherein:

the input sub-circuit is configured to provide a signal of a first reference voltage signal terminal to a pull-up node under control of an input signal terminal;

the output sub-circuit is configured to provide a signal of a clock signal terminal to a first signal output terminal under control of a potential of the pull-up node; and the output control sub-circuit is configured to provide a signal of the first signal output terminal to a second signal output terminal under joint control of an output control signal terminal, a third reference voltage signal terminal, and a fourth reference voltage signal terminal.

In some embodiments, in the shift register above according to the embodiments of the disclosure, the shift register further includes: a first pull-down node control sub-circuit, a pull-up node control sub-circuit, a second pull-down node control sub-circuit, and a reset sub-circuit, wherein:

the first pull-down node control sub-circuit is configured to provide a signal of the fourth reference voltage signal terminal to a pull-down node under control of the fourth reference voltage signal terminal;

the pull-up node control sub-circuit is configured to provide a signal of the third reference voltage signal terminal to the pull-up node and the first signal output terminal under control of a potential of the pull-down node;

the second pull-down node control sub-circuit is configured to provide the signal of the third reference voltage signal terminal respectively to the pull-down node and a first node under control of the potential of the pull-up node; and the reset sub-circuit is configured to provide a signal of a second reference voltage signal terminal to the pull-up node under control of a reset signal terminal.

In some embodiments, in the shift register above according to the embodiments of the disclosure, the input sub-circuit includes a first transistor, wherein:

a gate of the first transistor is connected with the input signal terminal, a first electrode of the first transistor is connected with the first reference voltage signal terminal, and a second electrode of the first transistor is connected with the pull-up node.

In some embodiments, in the shift register above according to the embodiments of the disclosure, the output control sub-circuit includes: a twelfth transistor, a thirteenth transistor and a fourteenth transistor, wherein:

a gate and a first electrode of the twelfth transistor are connected with the fourth reference voltage signal terminal, and a second electrode of the twelfth transistor is connected with a second node;

a gate of the thirteenth transistor is connected with the output control signal terminal, a first electrode of the thirteenth transistor is connected with the third reference voltage signal terminal, and a second electrode of the thirteenth transistor is connected with the second node; and a gate of the fourteenth transistor is connected with the second node, a first electrode of the fourteenth transistor is connected with the first signal output terminal, and a second electrode of the fourteenth transistor is connected with the second signal output terminal;

wherein the thirteenth transistor has a channel width to length ratio greater than that of the twelfth transistor.

In some embodiments, in the shift register above according to the embodiments of the disclosure, the first pull-down node control sub-circuit includes: an eighth transistor and a ninth transistor, wherein:

a gate of the eighth transistor is connected with the first node, a first electrode of the eighth transistor is connected with the fourth reference voltage signal terminal, and a second electrode of the eighth transistor is connected with the pull-down node; and a gate and a first electrode of the ninth transistor are connected with the fourth reference voltage signal terminal, and a second electrode of the ninth transistor is connected with the first node.

In some embodiments, in the shift register above according to the embodiments of the disclosure, the output sub-circuit includes: a third transistor and a first capacitor, wherein:

a gate of the third transistor is connected with the pull-up node, a first electrode of the third transistor is connected with the clock signal terminal, and a second electrode of the third transistor is connected with the first signal output terminal; and one terminal of the first capacitor is connected with the pull-up node, and the other terminal of the first capacitor is connected with the first signal output terminal.

In some embodiments, in the shift register above according to the embodiments of the disclosure, the pull-up node control sub-circuit includes: a tenth transistor and a fourth transistor, wherein:

a gate of the tenth transistor is connected with the pull-down node, a first electrode of the tenth transistor is connected with the third reference voltage signal terminal, and a second electrode of the tenth transistor is connected with the pull-up node; and a gate of the fourth transistor is connected with the pull-down node, a first electrode of the fourth transistor is connected with the third reference voltage signal terminal, and a second electrode of the fourth transistor is connected with the first signal output terminal.

In some embodiments, in the shift register above according to the embodiments of the disclosure, the second pull-down node control sub-circuit includes: a sixth transistor and a seventh transistor, wherein:

a gate of the sixth transistor is connected with the pull-up node, a first electrode of the sixth transistor is connected with the third reference voltage signal terminal, and a second electrode of the sixth transistor is connected with the pull-down node; and a gate of the seventh transistor is connected with the pull-up node, a first electrode of the seventh transistor is connected with third reference voltage signal terminal, and a second electrode of the seventh transistor is connected with the first node.

In some embodiments, in the shift register above according to the embodiments of the disclosure, the reset sub-circuit includes a second transistor, wherein:

a gate of the second transistor is connected with the reset signal terminal, a first electrode of the second transistor is connected with the second reference voltage signal terminal, and a second electrode of the second transistor is connected with the pull-up node.

In some embodiments, in the shift register above according to the embodiments of the disclosure, the shift register further includes: a first denoising sub-circuit and/or a second denoising sub-circuit, wherein:

the first denoising sub-circuit is configured to provide a signal of the third reference voltage signal terminal to the pull-up node under control of a first denoising control terminal; and the second denoising sub-circuit is configured to provide the signal of the third reference voltage signal terminal to the first signal output terminal under control of a second denoising control terminal.

In some embodiments, in the shift register above according to the embodiments of the disclosure, the first denoising sub-circuit includes an eleventh transistor, wherein: a gate of the eleventh transistor is connected with the first denoising control terminal, a first electrode of the eleventh transistor is connected with the third reference voltage signal terminal, and a second electrode of the eleventh transistor is connected with the pull-up node.

In some embodiments, in the shift register above according to the embodiments of the disclosure, the second denoising sub-circuit includes a fifth transistor, wherein:

a gate of the fifth transistor is connected with the second denoising control terminal, a first electrode of the fifth transistor is connected with the third reference voltage signal terminal, and a second electrode of the fifth transistor is connected with the first signal output terminal.

In some embodiments, in the shift register above according to the embodiments of the disclosure, each transistor is an N-type transistor or a P-type transistor.

In another aspect, the embodiments of the disclosure further provide a gate drive circuit including a plurality of cascaded shift registers above according to the embodiments of the disclosure, wherein:

a first signal output terminal of a shift register at each other level than a first level of the plurality of cascaded shift registers is connected with a reset signal terminal of a shift register at a preceding level adjacent thereto;

a first signal output terminal of a shift register at each other level than a last level of the plurality of cascaded shift registers is connected with an input signal terminal of a shift register at a succeeding level adjacent thereto; and second signal output terminals of shift registers at respective levels are configured to provide driving signals to their corresponding gate lines of a display panel.

In some embodiments, in the gate drive circuit above according to the embodiments of the disclosure, each of the plurality of cascaded shift registers further comprises: a first pull-down node control sub-circuit, a pull-up node control sub-circuit, a second pull-down node control sub-circuit, and a reset sub-circuit, wherein:

the first pull-down node control sub-circuit is configured to provide a signal of a fourth reference voltage signal terminal to a pull-down node under control of the fourth reference voltage signal terminal;

the pull-up node control sub-circuit is configured to provide a signal of a third reference voltage signal terminal to a pull-up node and a first signal output terminal under control of a potential of the pull-down node;

the second pull-down node control sub-circuit is configured to provide the signal of the third reference voltage signal terminal to the pull-down node and a first node respectively under control of a potential of the pull-up node; and the reset sub-circuit is configured to provide a signal of a second reference voltage signal terminal to the pull-up node under control of a reset signal terminal.

In some embodiments, in the gate drive circuit above according to the embodiments of the disclosure, each of the plurality of cascaded shift registers further comprises: a first denoising sub-circuit and/or a second denoising sub-circuit, wherein:

the first denoising sub-circuit is configured to provide a signal of a third reference voltage signal terminal to a pull-up node under control of a first denoising control terminal; and the second denoising sub-circuit is configured to provide the signal of the third reference voltage signal terminal to a first signal output terminal under control of a second denoising control terminal.

In some embodiments, in the gate drive circuit above according to the embodiments of the disclosure, an input signal terminal of a shift register at the first level is connected with a frame start signal terminal, and a reset signal terminal of a shift register at the last level is connected with a frame end signal terminal.

In some embodiments, in the gate drive circuit above according to the embodiments of the disclosure, clock signals to clock signal terminals of two adjacent shift registers are clock signals with opposite phases and a same period.

In still another aspect, the embodiments of the disclosure further provide a driving method in the gate drive circuit in above according to the embodiments of the disclosure, the method including:

outputting, by a first signal output terminal of a shift register, a cascading signal to a shift register at a next level;

providing, by an output control signal terminal of the shift register, a first electric level to an output control sub-circuit of the shift register so that a second signal output terminal of the shift register outputs a gate driving signal to a corresponding gate line; and providing, by the output control signal terminal of the shift register, a second electric level to the output control sub-circuit of the shift register so that the second signal output terminal of the shift register stops outputting the gate driving signal to the corresponding gate line.

In yet another aspect, the embodiments of the disclosure further provide a display device including the gate drive circuit above according to the embodiments of the disclosure.

BRIEF DESCRIPTION OF THE DRAWINGS

In order to make the technical solutions according to the embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

The gate drive circuit includes a plurality of cascaded shift registers, and a shift register at each level is configured to provide a gate ON signal to a gate line connected with a signal output terminal of the shift register at the level to enable a row of TFTs in a corresponding pixel area. However, in the gate drive circuit in the related art, a signal output terminal for cascading outputs the same signal as a signal output terminal for providing the gate ON signal to the gate line, so the entire display panel has to be scanned row by row, but an image cannot be displayed locally on the display panel, which cannot meet the display requirement for the display panel.

Accordingly, it is highly desirable for those skilled in the art to improve the gate drive circuit to thereby display an image locally on the display panel.

Particular implementations of the shift register, the gate drive circuit, the driving method thereof, and the display device according to the embodiments of the disclosure will be described below with reference to the drawings.

Figure 1:
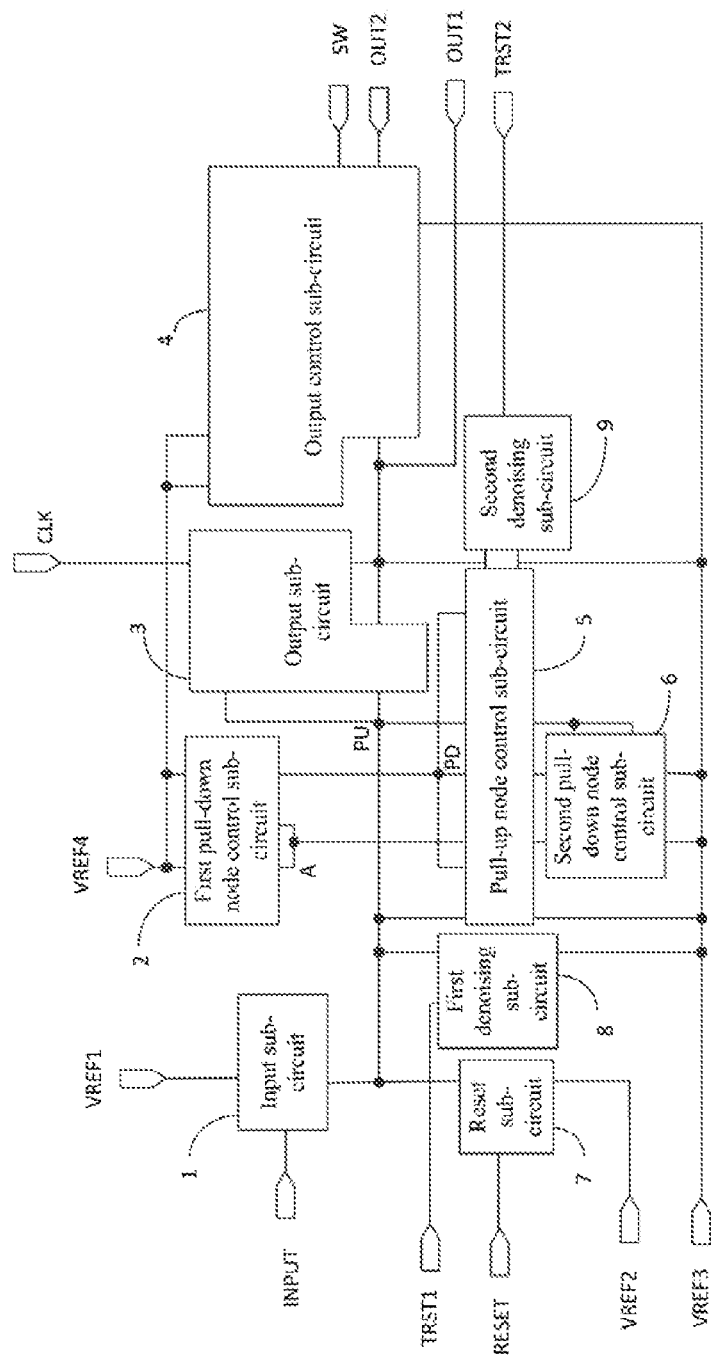
FIG. 1 is a schematic structural diagram of a shift register according to the embodiments of the disclosure.

As illustrated in FIG. 1, a shift register according to the embodiments of the disclosure includes: an input sub-circuit 1, an output sub-circuit 3, and an output control sub-circuit 4; where the input sub-circuit 1 is configured to provide a signal of a first reference voltage signal terminal VREF1 to a pull-up node PU under control of an input signal terminal INPUT; the output sub-circuit 3 is configured to provide a signal of a clock signal terminal CLK to a first signal output terminal OUT1 under control of a potential of the pull-up node PU; the output control sub-circuit 4 is configured to provide a signal of the first signal output terminal OUT1 to a second signal output terminal OUT2 under the joint control of an output control signal terminal SW, a third reference voltage signal terminal VREF3, and a fourth reference voltage signal terminal VREF4.

The shift register above according to the embodiments of the disclosure includes: an input sub-circuit, an output sub-circuit, and an output control sub-circuit, where the input sub-circuit is configured to provide a signal of a first reference voltage signal terminal to a pull-up node under the control of an input signal terminal; the output sub-circuit is configured to provide a signal of a clock signal terminal to a first signal output terminal under the control of the potential of the pull-up node; and the output control sub-circuit is configured to provide a signal of the first signal output terminal to a second signal output terminal under the joint control of an output control signal terminal, a third reference voltage signal terminal, and a fourth reference voltage signal terminal. The output control sub-circuit and the output control signal terminal are arranged, and the second signal output terminal is controlled using a signal output by the output control signal terminal to or not to output a driving signal to a corresponding gate line, so that an image is displayed locally on a display panel.

It shall be noted that, in the shift register above according to the embodiments of the disclosure, the first signal output terminal of the shift register is configured to be cascaded with a shift register at the upper level and a shift register at the lower level respectively, and the second signal output terminal is configured to provide a driving signal to a corresponding gate line in the display panel. In order to provide a driving signal to a corresponding gate line, that is, to display or refresh in a display area corresponding to the gate line, a first electric level is output at the output control signal terminal of the shift register so that the second signal output terminal of the shift register provides a driving signal to the corresponding gate line; and if no driving signal is to be provided by the shift register to the corresponding gate line, that is, no image is to be displayed or refreshed in the display area corresponding to the gate line, then a second electric level will be output at the output control signal terminal of the shift register so that no signal is output at the second signal output terminal of the shift register, that is, the second signal output terminal of the shift register does not output any signal to the corresponding gate line at this time, but no matter whether an image is to be displayed or refreshed in display areas corresponding to gate lines driven by the shift registers at the respective levels, signals are output at the first signal output terminals of the shift registers at the respective levels to cascade the shift registers, so that a gate driving signal for displaying is separate from a signal for cascading, and thus an image can be displayed locally on the display panel without affecting the cascading between the shift registers at the respective levels, and thus without affecting a display effect.

In some implementations, the shift register above according to the embodiments of the disclosure further includes: a first pull-down node control sub-circuit 2, a pull-up node control sub-circuit 5, a second pull-down node control sub-circuit 6, and a reset sub-circuit 7.

The first pull-down node control sub-circuit 2 is configured to provide a signal of the fourth reference voltage signal terminal VREF4 to a pull-down node PD under the control of the fourth reference voltage signal terminal VREF4.

The pull-up node control sub-circuit 5 is configured to provide a signal of the third reference voltage signal terminal VREF3 to the pull-up node PU and the first signal output terminal OUT1 under the control of the potential of the pull-down node PD.

The second pull-down node control sub-circuit 6 is configured to provide the signal of the third reference voltage signal terminal VREF3 to the pull-down node PD and a first node A respectively under control of the potential of the pull-up node PU.

The reset sub-circuit 7 is configured to provide a signal of a second reference voltage signal terminal VREF2 to the pull-up node PU under the control of a reset signal terminal RESET.

In the shift register above according to the embodiments of the disclosure, the input sub-circuit and the reset sub-circuit are designed symmetrically, so the shift register can further perform a bidirectional scanning function, in which, only the input signal terminal and the reset signal terminal are swapped and the first reference voltage signal terminal and the second reference voltage signal terminal are swapped to perform reverse scanning.

In some implementations, in the shift register above according to the embodiments of the disclosure, the input sub-circuit and the reset sub-circuit, both of which are designed symmetrically, can be swapped functionally, so the shift register above according to the embodiments of the disclosure can perform bidirectional scanning Where, in order to perform forward scanning, an input signal is received at the input signal terminal, and a reset signal is received at the reset signal terminal, so the input sub-circuit performs an input function, and the reset sub-circuit performs a reset function; and in order to perform reverse scanning, a reset signal is received at the input signal terminal, and an input signal is received at the reset signal terminal, so the reset sub-circuit performs an input function, and the input sub-circuit performs a reset function.

The disclosure will be described below in details in connection with particular embodiments thereof. It shall be noted that these embodiments are intended to better set forth the disclosure, but not to limit the disclosure thereto.

Figure 2:
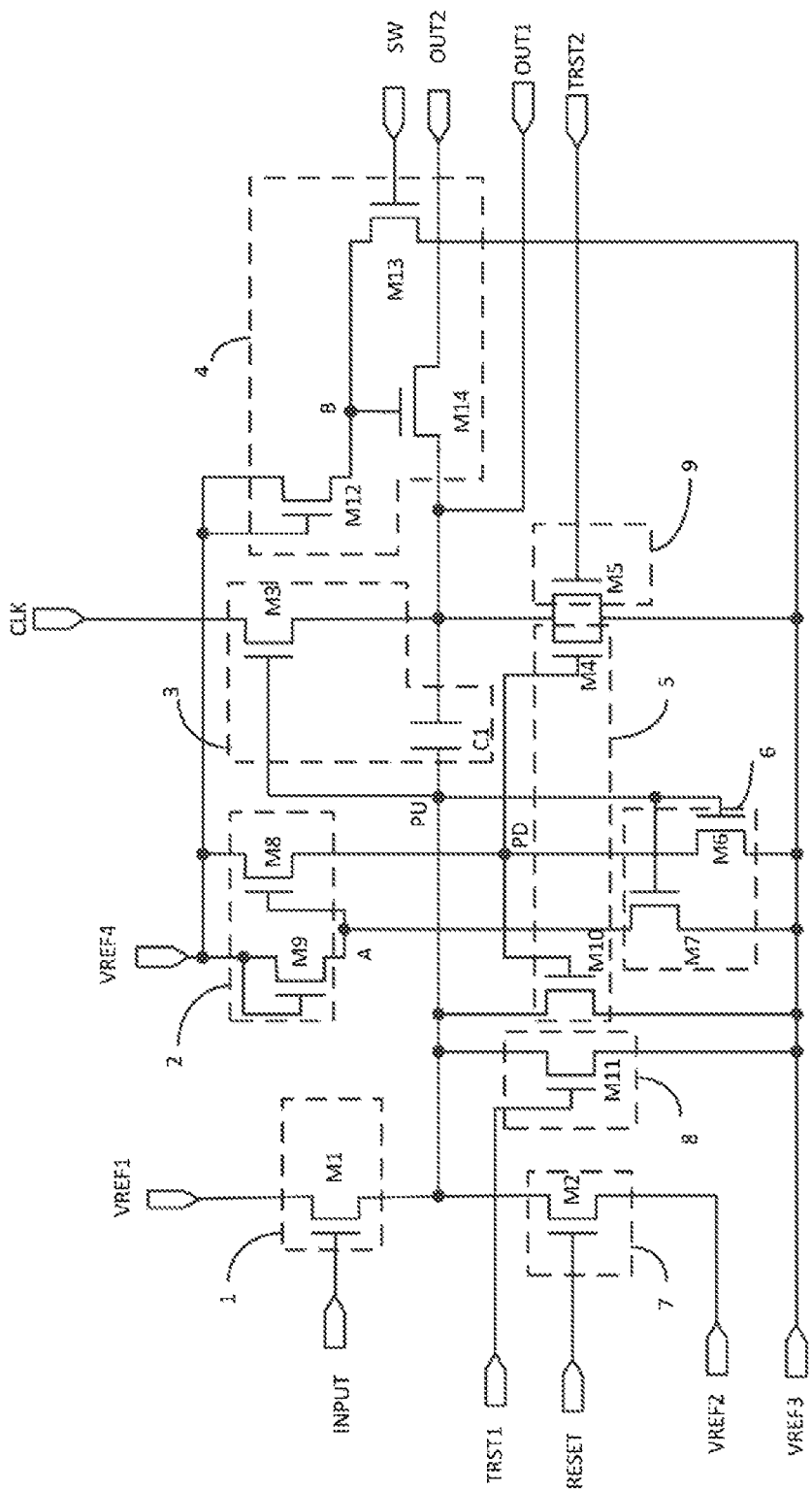
FIG. 2 is a schematic structural diagram in details of the shift register according to the embodiments of the disclosure.

In some embodiments, in the shift register above according to the embodiments of the disclosure, as illustrated in FIG. 2, the input sub-circuit 1 includes a first transistor M1.

A gate of the first transistor M1 is connected with the input signal terminal INPUT, a first electrode of the first transistor M1 is connected with the first reference voltage signal terminal VREF1, and a second electrode of the first transistor M1 is connected with the pull-up node PU.

A particular structure of the input sub-circuit in the shift register has been described above only by way of an example, and in a particular implementation, the particular structure of the input sub-circuit will not be limited to the structure above according to the embodiments of the disclosure, but can alternatively be another structure which can occur to those skilled in the art, and the embodiments of the disclosure will not be limited thereto.

In some embodiments, in the shift register above according to the embodiments of the disclosure, as illustrated in FIG. 2, the first pull-down node control sub-circuit 2 includes: an eighth transistor M8 and a ninth transistor M9.

A gate of the eighth transistor M8 is connected with the first node A, a first electrode of the eighth transistor M8 is connected with the fourth reference voltage signal terminal VREF4, and a second electrode of the eighth transistor M8 is connected with the pull-down node PD.

A gate and a first electrode of the ninth transistor M9 are connected with the fourth reference voltage signal terminal VREF4, and a second electrode of the ninth transistor M9 is connected with the first node A.

A particular structure of the first pull-down node control sub-circuit in the shift register has been described above only by way of an example, and in a particular implementation, the particular structure of the first pull-down node control sub-circuit will not be limited to the structure above according to the embodiments of the disclosure, but can alternatively be another structure which can occur to those skilled in the art, and the embodiments of the disclosure will not be limited thereto.

In some embodiments, in the shift register above according to the embodiments of the disclosure, as illustrated in FIG. 2, the output control sub-circuit 4 includes: a twelfth transistor M12, a thirteenth transistor M13, and a fourteenth transistor M14.

A gate and a first electrode of the twelfth transistor M12 are connected with the fourth reference voltage signal terminal VREF4, and a second electrode of the twelfth transistor M12 is connected with a second node B.

A gate of the thirteenth transistor M13 is connected with the output control signal terminal SW, a first electrode of the thirteenth transistor M13 is connected with the third reference voltage signal terminal VREF3, and a second electrode of the thirteenth transistor M13 is connected with the second node B.

A gate of the fourteenth transistor M14 is connected with the second node B, a first electrode of the fourteenth transistor M14 is connected with the first signal output terminal OUT1, and a second electrode of the fourteenth transistor M14 is connected with the second signal output terminal OUT2.

Where the thirteenth transistor M13 has a channel width to length ratio greater than that of the twelfth transistor M12.

It shall be noted that when there is a display state in the display area corresponding to the gate line driven by the shift register, a low-level signal is output at the output control signal terminal, and the thirteen transistor is turned off at this time; and since the fourth reference voltage signal terminal is at a high electric level, the twelfth transistor and the fourteenth transistor are turned on, and there is a normal output at the second signal output terminal to provide a driving signal to the corresponding gate line.

When there is a non-display state in the display area corresponding to the gate line driven by the shift register, since the fourth reference voltage signal terminal is at a high electric level so that the twelfth transistor is turned on, but since the output control signal terminal is at a high electric level, the thirteenth transistor is turned on to provide the signal of the third reference voltage signal terminal to the second node, and also since the thirteenth transistor has a channel width to length ratio greater than that of the twelfth transistor, the potential of the second node is pulled down, the fourteenth transistor is turned off, there is no signal output at the second signal output terminal, and the second signal output terminal remains at a low electric level, so no driving signal is provided to the corresponding gate line, and thus there is a non-display state in the display area corresponding to the gate line driven by the shift register.

In some implementations, in the shift register above according to the embodiments of the disclosure, the thirteenth transistor has a channel width to length ratio five times to that of the twelfth transistor.

A particular structure of the output control sub-circuit in the shift register has been described above only by way of an example, and in a particular implementation, the particular structure of the output control sub-circuit will not be limited to the structure above according to the embodiments of the disclosure, but can alternatively be another structure which can occur to those skilled in the art, and the embodiments of the disclosure will not be limited thereto.

In some embodiments, in the shift register above according to the embodiments of the disclosure, as illustrated in FIG. 2, the output sub-circuit 3 includes: a third transistor M3 and a first capacitor C1.

A gate of the third transistor M3 is connected with the pull-up node PU, a first electrode of the third transistor M3 is connected with the clock signal terminal CLK, and a second electrode of the third transistor M3 is connected with the first signal output terminal OUT1.

One terminal of the first capacitor C1 is connected with the pull-up node PU, and the other terminal of the first capacitor C1 is connected with the first signal output terminal OUT1.

A particular structure of the output sub-circuit in the shift register has been described above only by way of an example, and in a particular implementation, the particular structure of the output sub-circuit will not be limited to the structure above according to the embodiments of the disclosure, but can alternatively be another structure which can occur to those skilled in the art, and the embodiments of the disclosure will not be limited thereto.

In some embodiments, in the shift register above according to the embodiments of the disclosure, as illustrated in FIG. 2, the pull-up node control sub-circuit 5 includes: a tenth transistor M10 and a fourth transistor M4.

A gate of the tenth transistor M10 is connected with the pull-down node PD, a first electrode of the tenth transistor M10 is connected with the third reference voltage signal terminal VREF3, and a second electrode of the tenth transistor M10 is connected with the pull-up node PU.

A gate of the fourth transistor M4 is connected with the pull-down node PD, a first electrode of the fourth transistor M4 is connected with the third reference voltage signal terminal VREF3, and a second electrode of the fourth transistor M4 is connected with the first signal output terminal OUT1.

A particular structure of the pull-up node control sub-circuit in the shift register has been described above only by way of an example, and in a particular implementation, the particular structure of the pull-up node control sub-circuit will not be limited to the structure above according to the embodiments of the disclosure, but can alternatively be another structure which can occur to those skilled in the art, and the embodiments of the disclosure will not be limited thereto.

In some embodiments, in the shift register above according to the embodiments of the disclosure, as illustrated in FIG. 2, the second pull-down node control sub-circuit 6 includes: a sixth transistor M6 and a seventh transistor M7.

A gate of the sixth transistor M6 is connected with the pull-up node PU, a first electrode of the sixth transistor M6 is connected with the third reference voltage signal terminal VREF3, and a second electrode of the sixth transistor M6 is connected with the pull-down node PD.

A gate of the seventh transistor M7 is connected with the pull-up node PU, a first electrode of the seventh transistor M7 is connected with third reference voltage signal terminal VREF3, and a second electrode of the seventh transistor M7 is connected with the first node A.

A particular structure of the second pull-down node control sub-circuit in the shift register has been described above only by way of an example, and in a particular implementation, the particular structure of the second pull-down node control sub-circuit will not be limited to the structure above according to the embodiments of the disclosure, but can alternatively be another structure which can occur to those skilled in the art, and the embodiments of the disclosure will not be limited thereto.

In some embodiments, in the shift register above according to the embodiments of the disclosure, as illustrated in FIG. 2, the reset sub-circuit 7 includes a second transistor M2.

A gate of the second transistor M2 is connected with the reset signal terminal RESET, a first electrode of the second transistor M2 is connected with the second voltage signal terminal VREF2, and a second electrode of the second transistor M2 is connected with the pull-up node PU.

A particular structure of the reset sub-circuit in the shift register has been described above only by way of an example, and in a particular implementation, the particular structure of the reset sub-circuit will not be limited to the structure above according to the embodiments of the disclosure, but can alternatively be another structure which can occur to those skilled in the art, and the embodiments of the disclosure will not be limited thereto.

In some embodiments, in the shift register above according to the embodiments of the disclosure, as illustrated in FIG. 1, the shift register further includes: a first denoising sub-circuit 8 and/or a second denoising sub-circuit 9.

The first denoising sub-circuit 8 is configured to provide the signal of the third reference voltage signal terminal VREF3 to the pull-up node PU under the control of a first denoising control terminal TRST1.

The second denoising sub-circuit 9 is configured to provide the signal of the third reference voltage signal terminal VREF3 to the first signal output terminal OUT1 under the control of a second denoising control terminal TRST2.

In some implementations, in the shift register above according to the embodiments of the disclosure, as illustrated in FIG. 2, the first denoising sub-circuit 8 includes an eleventh transistor M11.

A gate of the eleventh transistor M11 is connected with the first denoising control terminal TRST1, a first electrode of the eleventh transistor M11 is connected with the third reference voltage signal terminal VREF3, and a second electrode of the eleventh transistor M11 is connected with the pull-up node PU.

A particular structure of the first denoising sub-circuit in the shift register has been described above only by way of an example, and in a particular implementation, the particular structure of the first denoising sub-circuit will not be limited to the structure above according to the embodiments of the disclosure, but can alternatively be another structure which can occur to those skilled in the art, and the embodiments of the disclosure will not be limited thereto.

In some implementations, in the shift register above according to the embodiments of the disclosure, as illustrated in FIG. 2, the second denoising sub-circuit 9 includes a fifth transistor M5.

A gate of the fifth transistor M5 is connected with the second denoising control terminal TRST2, a first electrode of the fifth transistor M5 is connected with the third reference voltage signal terminal VREF3, and a second electrode of the fifth transistor M5 is connected with the first signal output terminal OUT1.

A particular structure of the second denoising sub-circuit in the shift register has been described above only by way of an example, and in a particular implementation, the particular structure of the second denoising sub-circuit will not be limited to the structure above according to the embodiments of the disclosure, but can alternatively be another structure which can occur to those skilled in the art, and the embodiments of the disclosure will not be limited thereto.

In some implementations, in the shift register above according to the embodiments of the disclosure, in order to simplify a fabrication process, all the transistors are typically transistors made of the same material, so each of the transistors is an N-type transistor or a P-type transistor. In some embodiments, when each of the transistors in the shift register is an N-type transistor, a valid electric level for turning on each transistor is a high electric level for the gate of the transistor; and when each of the transistors in the shift register is a P-type transistor, a valid electric level for turning on each transistor is a low electric level for the gate of the transistor.

It shall be noted that, each of the transistors as mentioned in the embodiments above of the disclosure is a Metal Oxide Semiconductor Field-Effect Transistor (MOSFET) or a Thin Film Transistor (TFT). In some embodiments, the first electrode of each transistor is a source, and the second electrode thereof is a drain, or the first electrode is a drain, and the second electrode is a source, so they will not be distinguished here from each other.

An operating process of the shift register above according to the embodiments of the disclosure will be described below taking forward scanning as an example with reference to a circuit timing diagram thereof. In the following description, 1 represents a high-level signal, and 0 represents a low-level signal.

Figure 3:
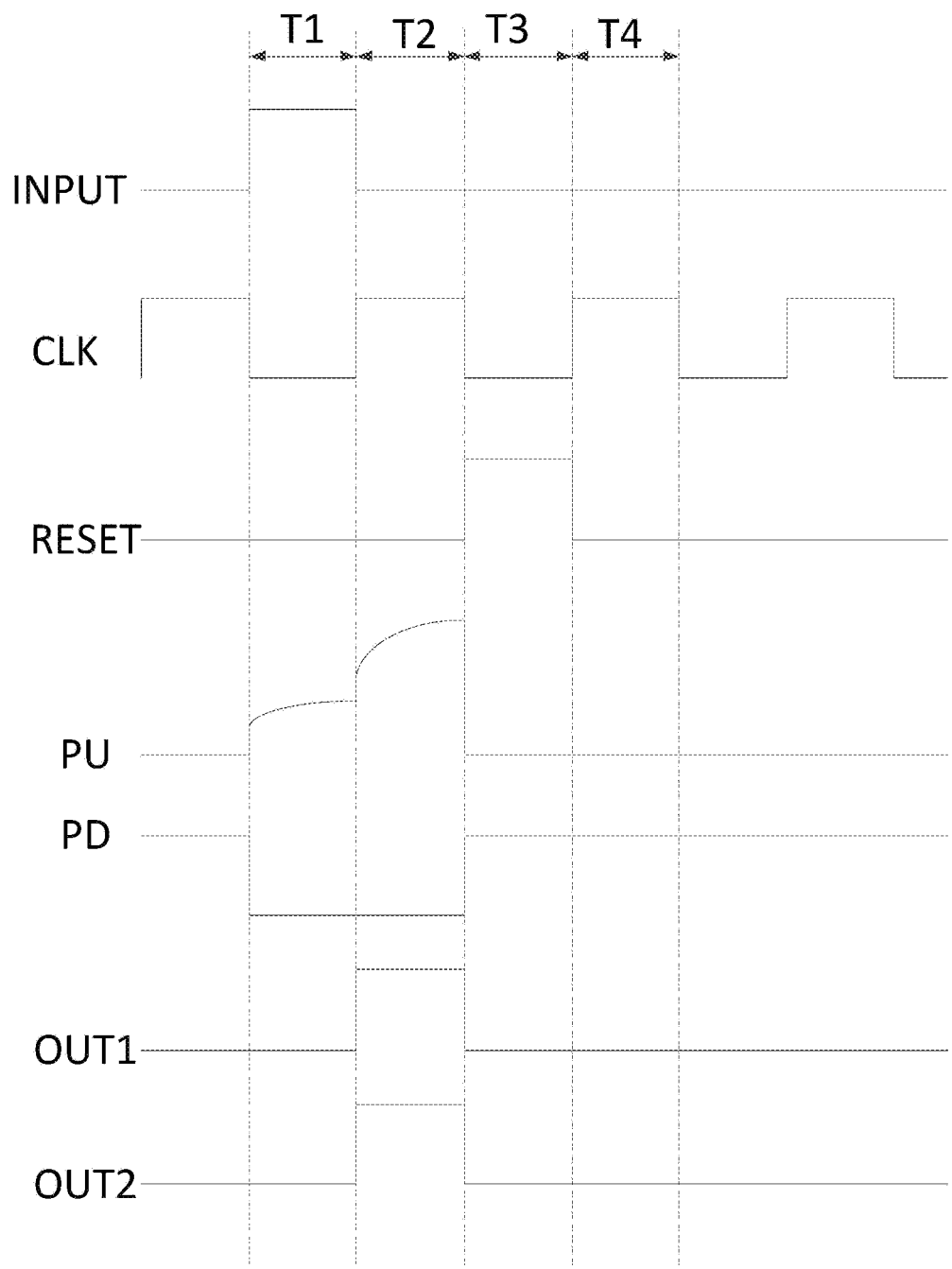
FIG. 3 is a first input-output timing diagram corresponding to the shift register as illustrated in FIG. 2.

In some embodiments, taking the shift register as illustrated in FIG. 2 as an example, each of the transistors in the shift register as illustrated in FIG. 2 is an N-type transistor, and there are high potentials at the first reference voltage signal terminal VREF1 and the fourth reference voltage signal terminal VREF 4, and low potentials at the second reference voltage signal terminal VREF2, the third reference voltage signal terminal VREF3 and the output control signal terminal SW. FIG. 3 illustrates a corresponding input-output timing diagram thereof.

In a stage T1, INPUT=1, CLK=0, and RESET=0.

The first transistor M1 is turned on by the signal of the input signal terminal INPUT, and the potential of the pull-up node PU is pulled up by the signal of the first reference voltage signal terminal VREF1 through the first transistor M1; the pull-up node PU controls the sixth transistor M6 and the seventh transistor M7 to be turned on; the sixth transistor M6 which is turned on provides the signal of the third reference voltage signal terminal VREF3 to the pull-down node PD, and the seventh transistor M7 which is turned on provides the signal of the third reference voltage signal terminal VREF3 to the first node A, so that the potential of the pull-down node PD is pulled down, and the fourth transistor M4 and the tenth transistor M10 are turned off, so that the voltage of the pull-up node PU and the first signal output terminal OUT1 remains stable. Since the fourth reference voltage signal terminal VREF4 is at a high electric level, and the output control signal terminal SW is at a low electric level, the twelfth transistor M12 and the fourteenth transistor M14 are turned on, but since the clock signal terminal CLK is at a low electric level, a low-level signal is output at both the first signal output terminal OUT1 and the second signal output terminal OUT2 respectively.

In a stage T2, INPUT=0, CLK=1, and RESET=0.

Since the input signal terminal INPUT is at a low electric level, the first transistor M1 is turned off, the pull-up node PU remains at a high potential, and the third transistor M3 is turned on; and the signal of the clock signal terminal CLK is at a high electric level at this time, and the voltage of the pull-up node PU is further pulled up due to the bootstrapping effect of a capacitor. Since the fourth reference voltage signal terminal VREF4 is at a high electric level and the output control signal terminal SW is at a low electric level, the thirteenth transistor M13 is turned off and the twelfth transistor M12 and the fourteenth transistor M14 are turned on, so the clock signal is output at both the first signal output terminal OUT1 and the second signal output terminal OUT2 respectively, that is, a high-level signal is output at both the first signal output terminal OUT1 and the second signal output terminal OUT2 respectively. As can be appreciated, N-type transistors for driving pixels in a display panel are connected with the second signal output terminal OUT2, and the shift register enables the corresponding gate line in the display panel to drive the corresponding row of pixels.

In a stage T3, INPUT=0, CLK=0, and RESET=1.

With a high-level signal at the reset signal terminal RESET, the second transistor M2 is turned on, and the potential of the pull-up node PU is pulled down, so that the sixth transistor M6 and the seventh transistor M7 are turned off; since the voltage of the fourth reference voltage signal terminal VREF4 is at a high electric level and the eighth transistor M8 and the ninth transistor M9 are turned on so that the pull-down node PD is at a high potential, so the fourth transistor M4 and the tenth transistor M10 are turned on to provide the signal of the third reference voltage signal terminal VREF3 to the pull-up node PU, the first signal output terminal OUT1, and the second signal output terminal OUT2, that is, the potential of the pull-up node PU, the first signal output terminal OUT1, and the second signal output terminal OUT2 is pulled down respectively.

In a stage T4, INPUT=0, CLK=1, and RESET=0.

Since the input signal terminal INPUT is at a low electric level, the first transistor M1 is turned off, and since the voltage of the fourth reference voltage signal terminal VREF4 is at a high electric level, the eighth transistor M8 and the ninth transistor M9 are turned on; and when there is no output, the pull-down node PD remains at a high potential, and the fourth transistor M4 and the tenth transistor M10 are turned on, so the pull-up node PU, the first signal output terminal OUT1, and the second signal output terminal OUT2 are denoised constantly, so that noisy voltage produced by the clock signal terminal CLK can be eliminated to thereby output a signal at low electric level so as to guarantee the stability of the signal output.

Further to the stages above, the shift register repeats the stage T4 to denoise the pull-up node PU, the first signal output terminal OUT1, and the second signal output terminal OUT2 constantly until the next frame arrives. After the previous frame ends and before the next frames arrives, both the first denoising control terminal TRST1 and the second denoising control terminal TRST2 are at a high electric level so that the fifth transistor M5 and the eleventh transistor M11 are turned on, thus denoising the pull-up node PU, the first signal output terminal OUT1, and the second signal output terminal OUT2.

Figure 4:
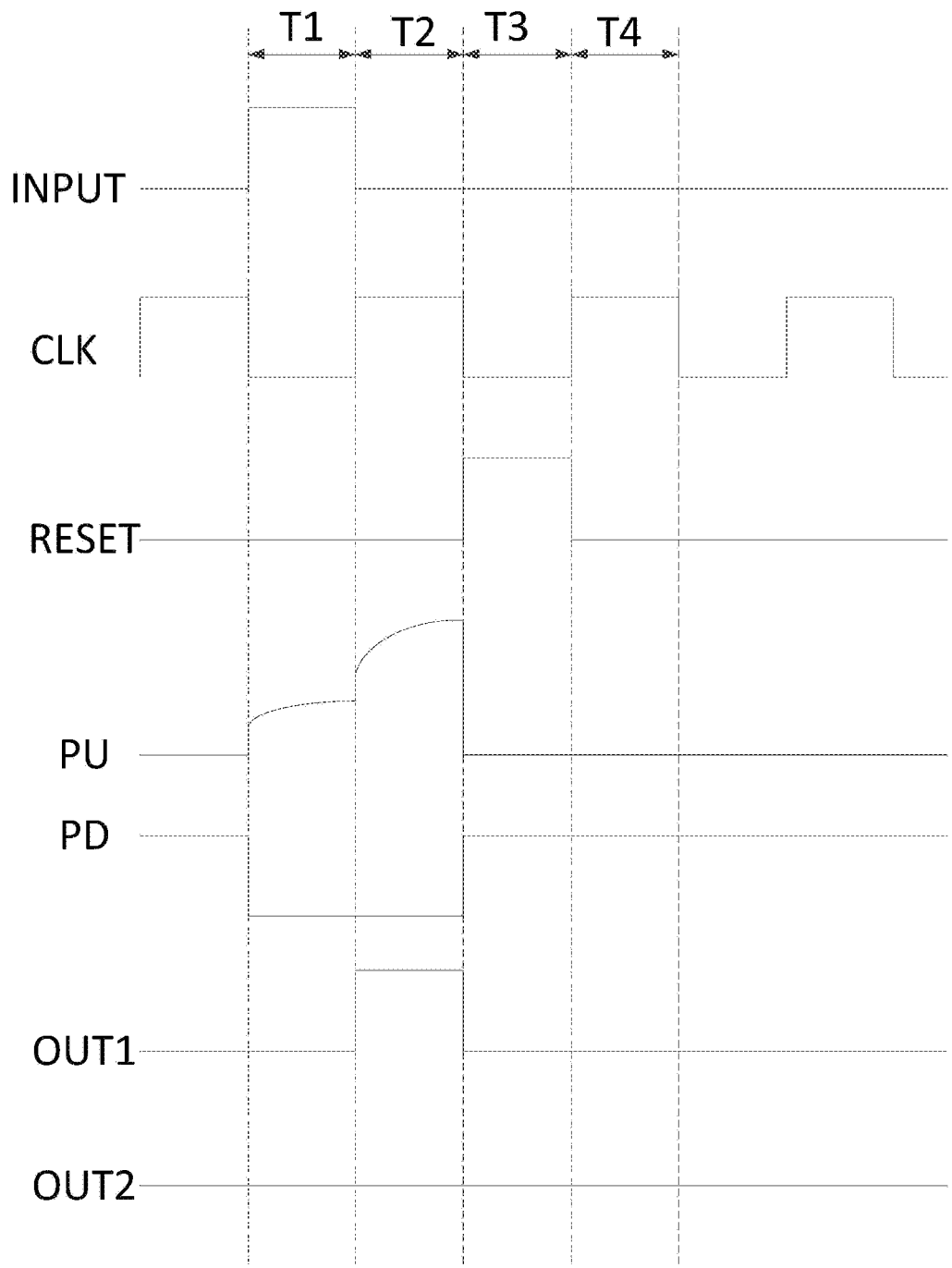
FIG. 4 is a second input-output timing diagram corresponding to the shift register as illustrated in FIG. 2.

In some embodiments, taking the shift register as illustrated in FIG. 2 as an example, each of the transistors in the shift register as illustrated in FIG. 2 is an N-type transistor, and there are high potentials at the first reference voltage signal terminal VREF1, the fourth reference voltage signal terminal VREF 4 and the output control signal terminal SW, and low potentials at the second reference voltage signal terminal VREF2 and the third reference voltage signal terminal VREF3. FIG. 4 illustrates a corresponding input-output timing diagram thereof.

In a stage T1, INPUT=1, CLK=0, and RESET=0.

The first transistor M1 is turned on by the signal of the input signal terminal INPUT, and the potential of the pull-up node PU is pulled up by the signal of the first reference voltage signal terminal VREF1 through the first transistor M1; the pull-up node PU controls the sixth transistor M6 and the seventh transistor M7 to be turned on; the sixth transistor M6 which is turned on provides the signal of the third reference voltage signal terminal VREF3 to the pull-down node PD, and the seventh transistor M7 which is turned on provides the signal of the third reference voltage signal terminal VREF3 to the first node A, so that the potential of the pull-down node PD is pulled down, and the fourth transistor M4 and the tenth transistor M10 are turned off, so that the voltage of the pull-up node PU and the first signal output terminal OUT1 remains stable. Since the fourth reference voltage signal terminal VREF4 is at a high electric level, and the output control signal terminal SW is at a low electric level, the twelfth transistor M12 and the fourteenth transistor M14 are turned on, but since the clock signal terminal CLK is at a low electric level, a low-level signal is output at both the first signal output terminal OUT1 and the second signal output terminal OUT2 respectively.

In a stage T2, INPUT=0, CLK=1, and RESET=0.

Since the input signal terminal INPUT is at a low electric level, the first transistor M1 is turned off, the pull-up node PU remains at a high potential, and the third transistor M3 is turned on; and at this time, the signal of the clock signal terminal CLK is at a high electric level, and the voltage of the pull-up node PU is further pulled up due to the bootstrapping effect of a capacitor. Since the fourth reference voltage signal terminal VREF4 is at a high electric level, the twelfth transistor M12 is turned on, but since the output control signal terminal SW is at a high electric level, the thirteenth transistor M13 is turned on to provide the signal of the third reference voltage signal terminal VREF3 to the second node B; and also since the thirteenth transistor M13 has a channel width to length ratio greater than that of the twelfth transistor M12, the potential of the second node B is pulled down, and the fourteenth transistor M14 is turned off, so no signal is output at the second signal terminal OUT2, and the second signal terminal OUT2 remains at a low electric level. The first signal output terminal OUT1 outputs a clock signal normally for cascading. As can be appreciated, since N-type transistors for driving pixels in a display panel, are connected with the second signal terminal OUT2, the shift register cannot enable the corresponding gate line in the display panel, and thus cannot drive the corresponding row of pixels to display an image.

In a stage T3, INPUT=0, CLK=0, and RESET=1.

With a high-level signal at the reset signal terminal RESET, the second transistor M2 is turned on, and the potential of the pull-up node PU is pulled down, so that the sixth transistor M6 and the seventh transistor M7 are turned off; since the voltage of the fourth reference voltage signal terminal VREF4 is at a high electric level, the eighth transistor M8 and the ninth transistor M9 are turned on so that the pull-down node PD is at a high potential, so the fourth transistor M4 and the tenth transistor M10 are turned on to provide the signal of the third reference voltage signal terminal VREF3 to the pull-up node PU and the first signal output terminal OUT1, that is, the potentials of the pull-up node PU and the first signal output terminal OUT1 are pulled down respectively.

In a stage T4, INPUT=0, CLK=1, and RESET=0.

Since the input signal terminal INPUT is at a low electric level, the first transistor M1 is turned off, and since the voltage of the fourth reference voltage signal terminal VREF4 is at a high electric level, the eighth transistor M8 and the ninth transistor M9 are turned on; and when there is no output, the pull-down node PD remains at a high potential, and the fourth transistor M4 and the tenth transistor M10 are turned on, so the pull-up node PU and the first signal output terminal OUT1 are denoised constantly, so that noisy voltage produced by the clock signal terminal CLK can be eliminated to thereby output a signal at low electric level so as to guarantee the stability of the signal output.

Figure 5:
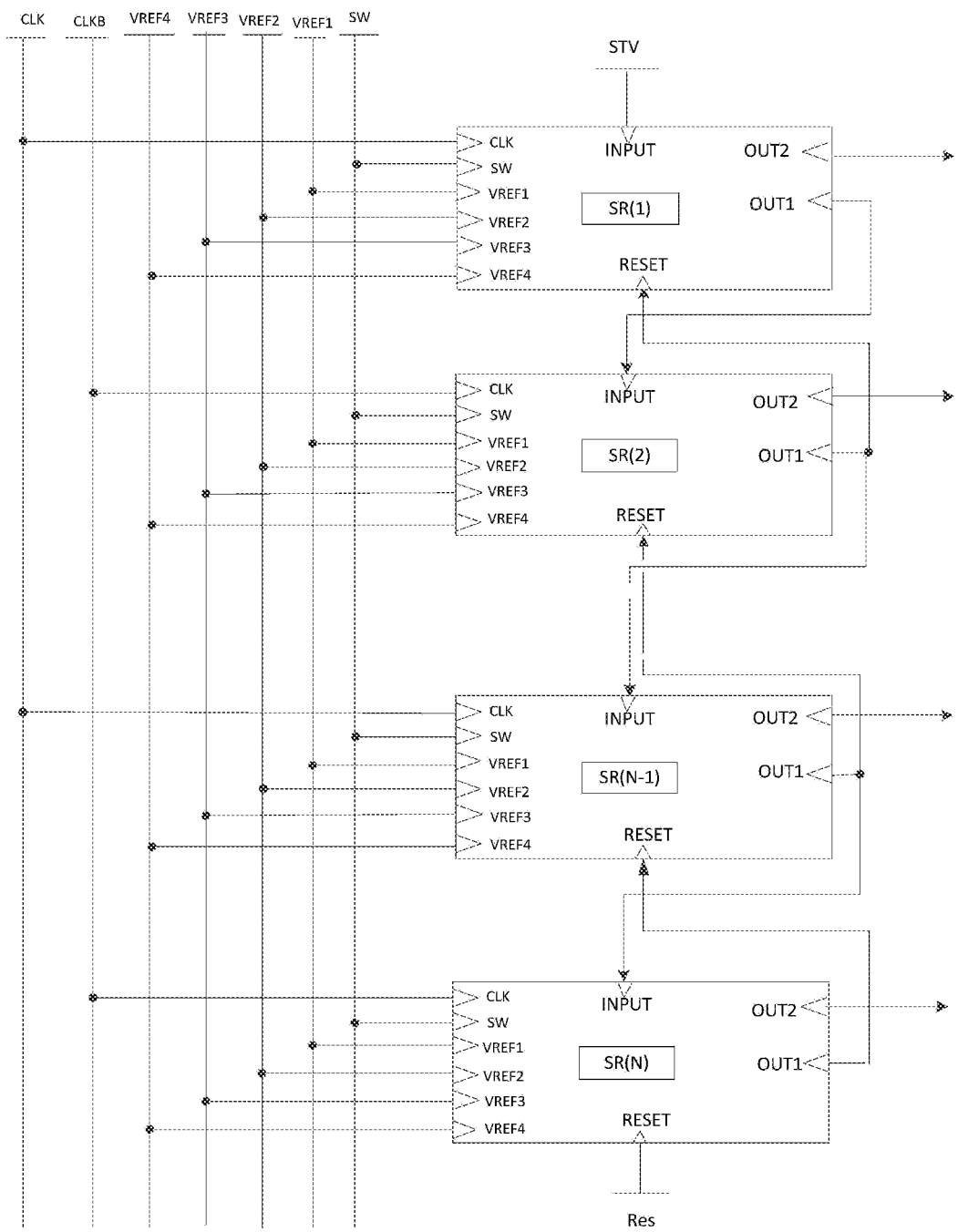
FIG. 5 is a schematic structural diagram of a gate drive circuit according to the embodiments of the disclosure.

Based upon the same inventive idea, the embodiments of the disclosure further provide a gate drive circuit as illustrated in FIG. 5 including a plurality of cascaded shift registers above according to the embodiments of the disclosure, SR(1), SR(2), SR(n), SR(N−1), SR(N) (N shift registers in total, where 1<n<N).

Except a shift register SR(N) at the last level, a first signal output terminal OUT1 of a shift register SR(n) at each other level than the last level is connected with an input signal terminal INPUT of a shift register SR(n+1) at the succeeding level adjacent thereto.

Except a shift register SR(1) at the first level, a first signal output terminal OUT1 of a shift register SR(n) at each other level than the first level is connected with a reset signal terminal RESET of a shift register SR(n−1) at the preceding level adjacent thereto.

The second signal output terminals OUT2 of shift registers at the respective levels are configured to provide driving signals to corresponding gate lines.

In some embodiments, in the gate drive circuit above according to the embodiments of the disclosure, as illustrated in FIG. 5, an input signal terminal INPUT of a shift register SR(1) at the first level is connected with a frame start signal terminal STV, and a reset signal terminal RESET of a shift register SR(N) at the last level is connected with a frame end signal terminal Res.

In some implementations, in the gate drive circuit above according to the embodiments of the disclosure, all the clock signal, the first reference voltage signal, the second reference voltage signal, the third reference voltage signal, the fourth reference voltage signal, and the output control signal are input into shift registers at the respective levels, and it shall be noted that, clock signals to clock signal terminals of two adjacent shift registers are clock signals with opposite phases and the same period, i.e., CLK and CLKB.

Based upon the same inventive idea, the embodiments of the disclosure further provide a method for driving the gate drive circuit above, where the method includes the following operations.

A first signal output terminal of a shift register outputs a cascading signal to a shift register at the next level.

An output control signal terminal of the shift register provides a first electric level to an output control sub-circuit of the shift register so that a second signal output terminal of the shift register outputs a gate driving signal to a corresponding gate line.

The output control signal terminal of the shift register provides a second electric level to the output control sub-circuit of the shift register so that the second signal output terminal of the shift register stops the gate driving signal from being output to the corresponding gate line.

Figure 6:
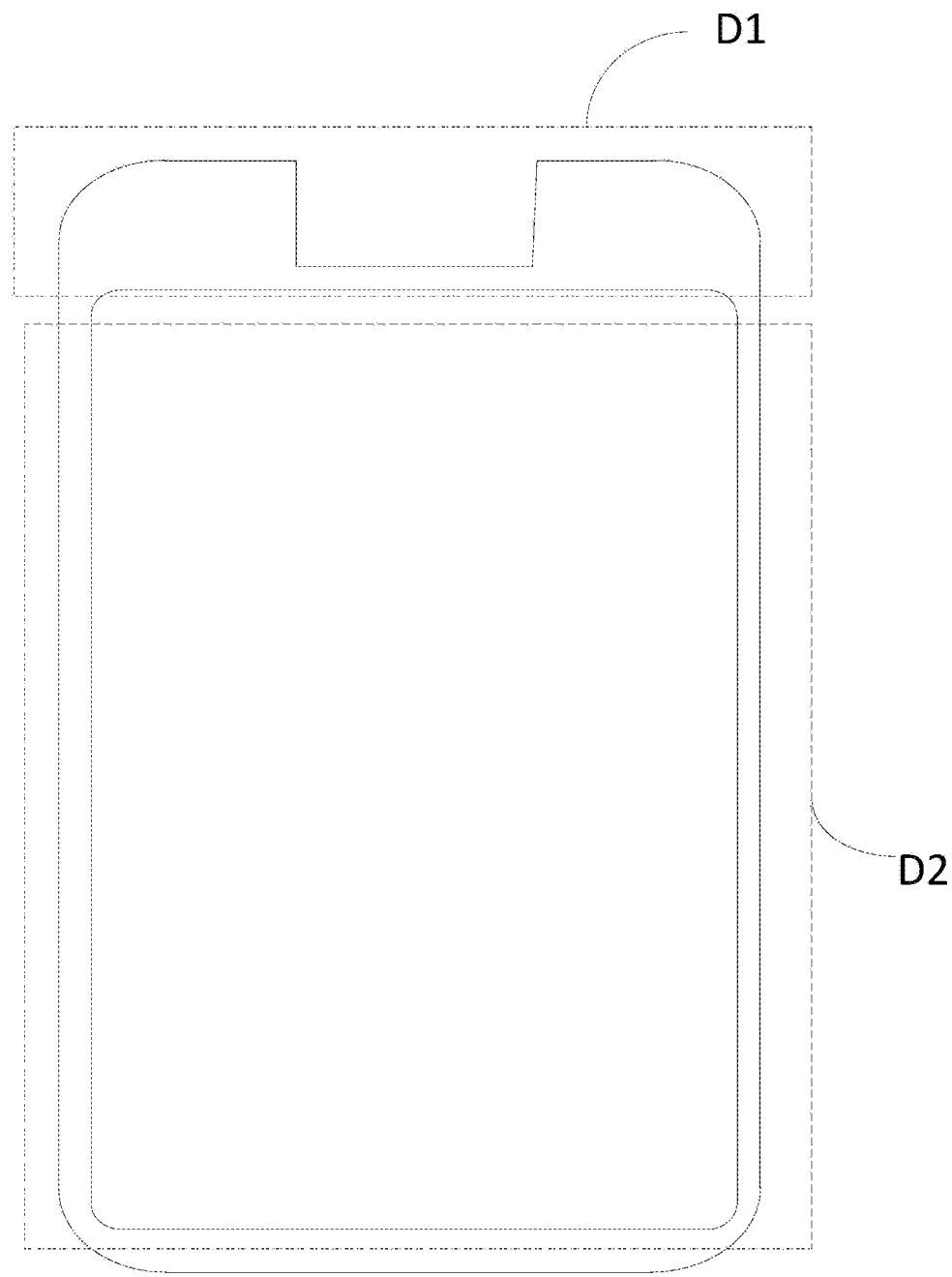
FIG. 6 is a schematic structural diagram of a display device according to the embodiments of the disclosure.

Based upon the same inventive idea, as illustrated in FIG. 6, the embodiments of the disclosure further provide a display device including the gate drive circuit above for providing scan signals to respective gate lines on an array substrate in the display device, where the display device includes a first display area D1 and a second display area D2.

Figure 7:
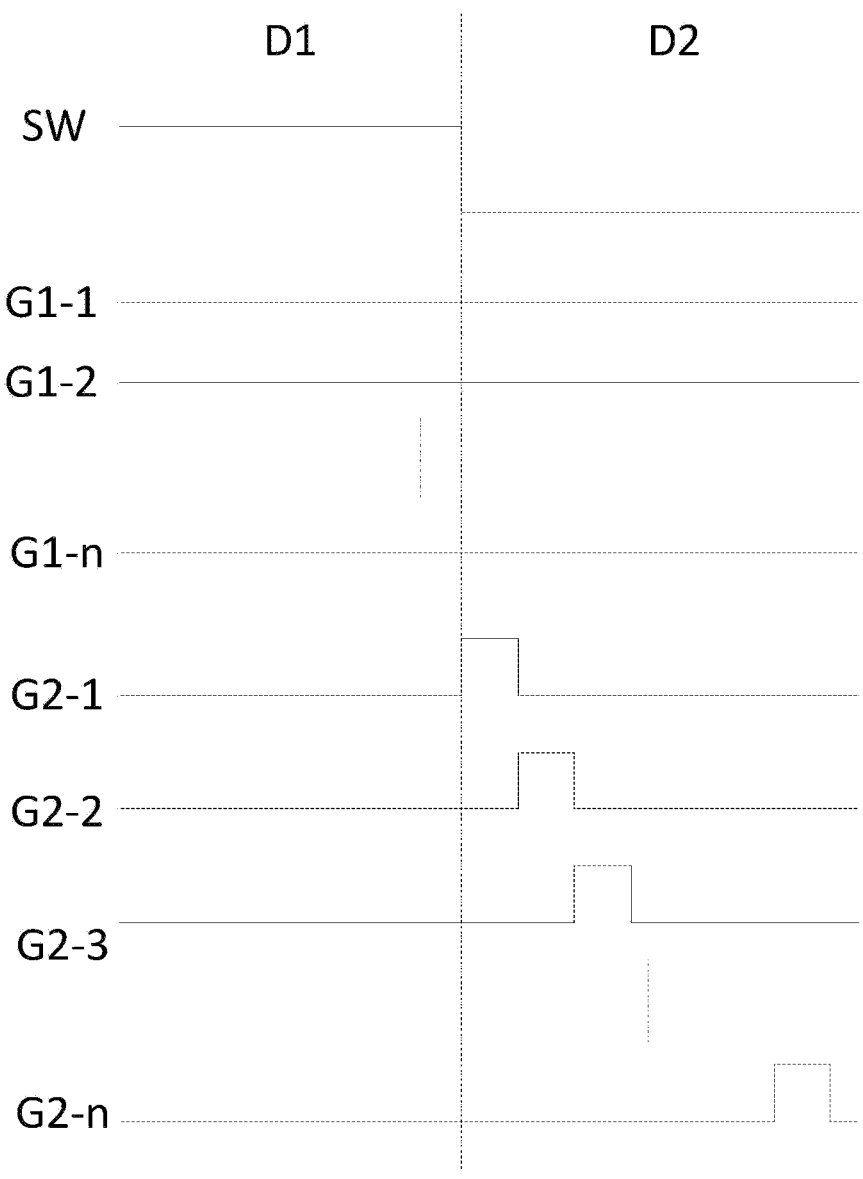
FIG. 7 is a timing diagram of displaying an image locally on the display device as illustrated in FIG. 6.

FIG. 7 illustrates a timing diagram of the first display area D1 in which no image is displayed, and the second display area D2 in which an image is displayed. Since no image is displayed in the first display area D1, in order to scan a gate line in the first display area D1, the output control signal terminal SW outputs a high-level signal so that only the first signal output terminal OUT1 outputs a signal for cascading, and no signal is output at the second signal output terminal OUT2; and since an image is displayed in the second display area D2, in order to scan a gate line in the second display area D2, the output control signal terminal SW outputs a low-level signal so that both the first signal output terminal OUT1 and the second signal output terminal OUT2 outputs signals. Reference can be made to the particular implementations of the embodiments above for a particular operating principle thereof, so a repeated description thereof will be omitted here.

It shall be noted that, the embodiment above in which the display area is divided into the first display area and the second display area is only a particular embodiment of the display area to be divided, but the display area can alternatively be divided otherwise without departing from the scope of the disclosure, so a repeated description thereof will be omitted here.

The display device can be a mobile phone, a tablet computer, a TV set, a monitor, a notebook computer, a digital photo frame, a navigator, or any other product or component with a display function. Reference can be made to the embodiments of the gate drive circuit above for an implementation of the display device, so a repeated description thereof will be omitted here.

In the shift register, the gate drive circuit, the driving method thereof, and the display device above according to the embodiments of the disclosure, the shift register includes: an input sub-circuit, an output sub-circuit, and an output control sub-circuit, where the input sub-circuit is configured to provide a signal of a first reference voltage signal terminal to a pull-up node under the control of an input signal terminal; the output sub-circuit is configured to provide a signal of a clock signal terminal to a first signal output terminal under the control of the potential of the pull-up node; and the output control sub-circuit is configured to provide a signal of the first signal output terminal to a second signal output terminal under the joint control of an output control signal terminal, a third reference voltage signal terminal, and a fourth reference voltage signal terminal. The output control sub-circuit and the output control signal terminal are arranged, and the second signal output terminal is controlled using a signal output at the output control signal terminal to or not to output a driving signal to a corresponding gate line, so that an image is displayed locally on a display panel.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A shift register, comprising: an input sub-circuit, an output sub-circuit, and an output control sub-circuit, wherein:
   the input sub-circuit is configured to provide a signal of a first reference voltage signal terminal to a pull-up node under control of an input signal terminal;
   the output sub-circuit is configured to provide a signal of a clock signal terminal to a first signal output terminal under control of a potential of the pull-up node; and
   the output control sub-circuit is configured to provide a signal of the first signal output terminal to a second signal output terminal under joint control of an output control signal terminal, a third reference voltage signal terminal, and a fourth reference voltage signal terminal;
   wherein the output control sub-circuit comprises: a twelfth transistor, a thirteenth transistor and a fourteenth transistor, wherein:
   a gate and a first electrode of the twelfth transistor are connected with the fourth reference voltage signal terminal, and a second electrode of the twelfth transistor is connected with a second node;
   a gate of the thirteenth transistor is connected with the output control signal terminal, a first electrode of the thirteenth transistor is connected with the third reference voltage signal terminal, and a second electrode of the thirteenth transistor is connected with the second node; and
   a gate of the fourteenth transistor is connected with the second node, a first electrode of the fourteenth transistor is connected with the first signal output terminal, and a second electrode of the fourteenth transistor is connected with the second signal output terminal;
   wherein the thirteenth transistor has a channel width to length ratio greater than that of the twelfth transistor.

2. The shift register according to claim 1, wherein the shift register further comprises: a first pull-down node control sub-circuit, a pull-up node control sub-circuit, a second pull-down node control sub-circuit, and a reset sub-circuit, wherein:
   the first pull-down node control sub-circuit is configured to provide a signal of the fourth reference voltage signal terminal to a pull-down node under control of the fourth reference voltage signal terminal;
   the pull-up node control sub-circuit is configured to provide a signal of the third reference voltage signal terminal to the pull-up node and the first signal output terminal under control of a potential of the pull-down node;
   the second pull-down node control sub-circuit is configured to provide the signal of the third reference voltage signal terminal to the pull-down node and a first node respectively, under control of the potential of the pull-up node; and
   the reset sub-circuit is configured to provide a signal of a second reference voltage signal terminal to the pull-up node under control of a reset signal terminal.

3. The shift register according to claim 1, wherein the input sub-circuit comprises a first transistor, wherein:
   a gate of the first transistor is connected with the input signal terminal, a first electrode of the first transistor is connected with the first reference voltage signal terminal, and a second electrode of the first transistor is connected with the pull-up node.

4. The shift register according to claim 2, wherein the first pull-down node control sub-circuit comprises: an eighth transistor and a ninth transistor, wherein:
   a gate of the eighth transistor is connected with the first node, a first electrode of the eighth transistor is connected with the fourth reference voltage signal terminal, and a second electrode of the eighth transistor is connected with the pull-down node; and
   a gate and a first electrode of the ninth transistor are connected with the fourth reference voltage signal terminal, and a second electrode of the ninth transistor is connected with the first node.

5. The shift register according to claim 2, wherein the output sub-circuit comprises: a third transistor and a first capacitor, wherein:
a gate of the third transistor is connected with the pull-up node, a first electrode of the third transistor is connected with the clock signal terminal, and a second electrode of the third transistor is connected with the first signal output terminal; and
one terminal of the first capacitor is connected with the pull-up node, and the other terminal of the first capacitor is connected with the first signal output terminal.

6. The shift register according to claim 2, wherein the pull-up node control sub-circuit comprises: a tenth transistor and a fourth transistor, wherein:
a gate of the tenth transistor is connected with the pull-down node, a first electrode of the tenth transistor is connected with the third reference voltage signal terminal, and a second electrode of the tenth transistor is connected with the pull-up node; and
a gate of the fourth transistor is connected with the pull-down node, a first electrode of the fourth transistor is connected with the third reference voltage signal terminal, and a second electrode of the fourth transistor is connected with the first signal output terminal.

7. The shift register according to claim 2, wherein the second pull-down node control sub-circuit comprises: a sixth transistor and a seventh transistor, wherein:
a gate of the sixth transistor is connected with the pull-up node, a first electrode of the sixth transistor is connected with the third reference voltage signal terminal, and a second electrode of the sixth transistor is connected with the pull-down node; and
a gate of the seventh transistor is connected with the pull-up node, a first electrode of the seventh transistor is connected with third reference voltage signal terminal, and a second electrode of the seventh transistor is connected with the first node.

8. The shift register according to claim 2, wherein the reset sub-circuit comprises a second transistor, wherein:
a gate of the second transistor is connected with the reset signal terminal, a first electrode of the second transistor is connected with the second reference voltage signal terminal, and a second electrode of the second transistor is connected with the pull-up node.

9. The shift register according to claim 1, wherein the shift register further comprises: a first denoising sub-circuit and/or a second denoising sub-circuit, wherein:
the first denoising sub-circuit is configured to provide a signal of the third reference voltage signal terminal to the pull-up node under control of a first denoising control terminal; and
the second denoising sub-circuit is configured to provide the signal of the third reference voltage signal terminal to the first signal output terminal under control of a second denoising control terminal.

10. The shift register according to claim 9, wherein the first denoising sub-circuit comprises an eleventh transistor, wherein:
a gate of the eleventh transistor is connected with the first denoising control terminal, a first electrode of the eleventh transistor is connected with the third reference voltage signal terminal, and a second electrode of the eleventh transistor is connected with the pull-up node.

11. The shift register according to claim 9, wherein the second denoising sub-circuit comprises a fifth transistor, wherein:
a gate of the fifth transistor is connected with the second denoising control terminal, a first electrode of the fifth transistor is connected with the third reference voltage signal terminal, and a second electrode of the fifth transistor is connected with the first signal output terminal.

12. The shift register according to claim 3, wherein each transistor is an N-type transistor or a P-type transistor.

13. A gate drive circuit, comprising a plurality of cascaded shift registers according to claim 1, wherein:
a first signal output terminal of a shift register at each other level than a first level of the plurality of cascaded shift registers is connected with a reset signal terminal of a shift register at a preceding level adjacent thereto;
a first signal output terminal of a shift register at each other level than a last level of the plurality of cascaded shift registers is connected with an input signal terminal of a shift register at a succeeding level adjacent thereto; and
second signal output terminals of shift registers at respective levels are configured to provide driving signals to corresponding gate lines of a display panel.

14. The gate drive circuit according to claim 13, wherein each of the plurality of cascaded shift registers further comprises: a first pull-down node control sub-circuit, a pull-up node control sub-circuit, a second pull-down node control sub-circuit, and a reset sub-circuit, wherein:
the first pull-down node control sub-circuit is configured to provide a signal of a fourth reference voltage signal terminal to a pull-down node under control of the fourth reference voltage signal terminal;
the pull-up node control sub-circuit is configured to provide a signal of a third reference voltage signal terminal to a pull-up node and a first signal output terminal under control of a potential of the pull-down node;
the second pull-down node control sub-circuit is configured to provide the signal of the third reference voltage signal terminal to the pull-down node and a first node respectively under control of a potential of the pull-up node; and
the reset sub-circuit is configured to provide a signal of a second reference voltage signal terminal to the pull-up node under control of a reset signal terminal.

15. The gate drive circuit according to claim 13, wherein each of the plurality of cascaded shift registers further comprises: a first denoising sub-circuit and/or a second denoising sub-circuit, wherein:
the first denoising sub-circuit is configured to provide a signal of a third reference voltage signal terminal to a pull-up node under control of a first denoising control terminal; and
the second denoising sub-circuit is configured to provide the signal of the third reference voltage signal terminal to a first signal output terminal under control of a second denoising control terminal.

16. The gate drive circuit according to claim 13, an input signal terminal of a shift register at the first level is connected with a frame start signal terminal, and a reset signal terminal of a shift register at the last level is connected with a frame end signal terminal.

17. The gate drive circuit according to claim 13, clock signals to clock signal terminals of two adjacent shift registers are clock signals with opposite phases and a same period.

18. A method for driving the gate drive circuit according to claim 13, the method comprising:
- outputting, by a first signal output terminal of a shift register, a cascading signal to a shift register at a next level;
- providing, by an output control signal terminal of the shift register, a first electric level to an output control sub-circuit of the shift register so that a second signal output terminal of the shift register outputs a gate driving signal to a corresponding gate line; and
- providing, by the output control signal terminal of the shift register, a second electric level to the output control sub-circuit of the shift register so that the second signal output terminal of the shift register stops outputting the gate driving signal to the corresponding gate line.

19. A display device, comprising the gate drive circuit according to claim 13.

\* \* \* \* \*